INVENTORS
CONRAD J. SOLBERG
LAWRENCE S. HILLE
HENRY W. SCHOENHERR
RUSSELL V. SOLSTAD
Cushman, Darby & Cushman
ATTORNEYS INVENTORS
CONRAD J. SOLBERG
LAWRENCE S. HILLE
HENRY W. SCHOENHERR
RUSSELL V. SOLSTAD Cushman, Darby & Cushman
ATTORNEYS United States Patent Office 3,449,828
Patented June 17, 1969

3,449,828

METHOD FOR PRODUCING CIRCUIT MODULE

Conrad J. Solberg, White Bear Lake, Lawrence S. Hille, Minneapolis, and Henry W. Schoenherr and Russell V. Solstad, St. Paul, Minn., assignors to Control Data Corporation, South Minneapolis, Minn., a corporation of Minnesota Filed Sept. 28, 1966, Ser. No. 582,697
Int. Cl. H01c *17/00*
U.S. Cl. 29—620 21 Claims

ABSTRACT OF THE DISCLOSURE

A process for producing an electrical component on a substrate wherein the length and width of the component are established, respectively, by separate etching steps. To facilitate the manufacture of such a component in mass production, masks used to define the areas to be etched are dimensionally related to provide a substantial tolerance when the masks are registered with one another, without having any effect on the critical length and width dimensions of the resultant component.

This invention relates to a process for producing electrical components on a substrate and, more particularly, to the mass production of extremely table, miniature circuit modules where each module includes active and passive components on a substrate.

Heretofore in the production of resistors on substrates of circuit modules, many circuits have been rejected whenever close etching tolerances had to be maintained on resistors. Computer circuitry generally requires mass producing a large number of these circuits, while at the same time maintaining the close etching tolerances without having to trim down each circuit after etching. Thus, it is a primary purpose of this invention to decrease the cost of mass producing such circuit modules while at the same time maintaining a high degree of accuracy of component values.

Further, it is known in the art of circuit module manufacture that heavily plated conductive films or layers readily facilitate the bonding of electrical connectors or leads and semi-conductor dies thereupon. This conductive layer is generally formed on top of a film or layer of resistive material from which the resistors are formed. However, it is difficult to selectively etch heavily plated conductive layers to uncover the areas which are to become resistors.

Therefore, a further primary purpose of this invention is to employ two masking sequences which respectively define the resistors and the electrical connectors thereto. By this approach the task of selectively etching heavily plated films becomes relatively easy compared with prior art approaches.

It is another purpose of this invention to bond electrical leads and semiconductor dies to a circuit module while at the same time anneal resistors formed from layers or films deposited on a substrate and thereby stabilize the value thereof.

It is another object of this invention to employ unique combination solutions for etching materials deposited on a substrate and thereby form electrical components from the deposited materials.

Other objects and advantages of this invention will become apparent upon reading the appended claims in conjunction with the following detailed description and the attached drawings, in which:

Figures 1, 2:
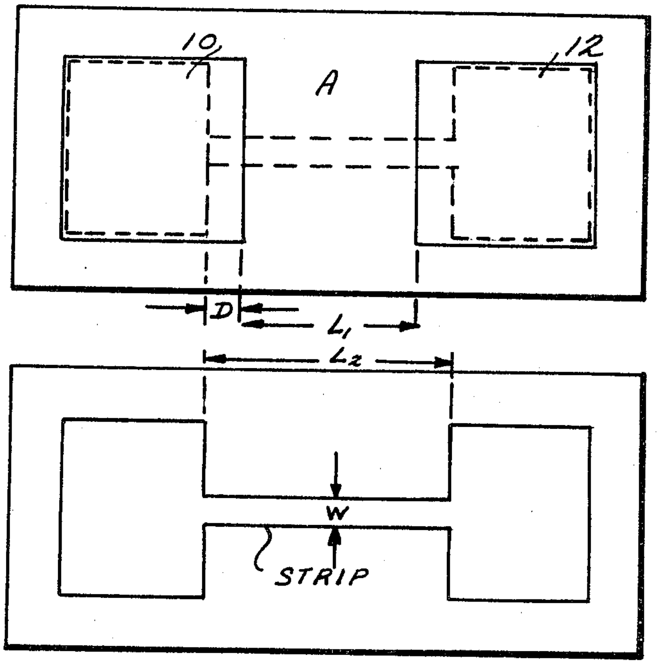
FIGURES 1 and 2 are masks for producing one resistor and electrical connectors therefor.
Figure 8:
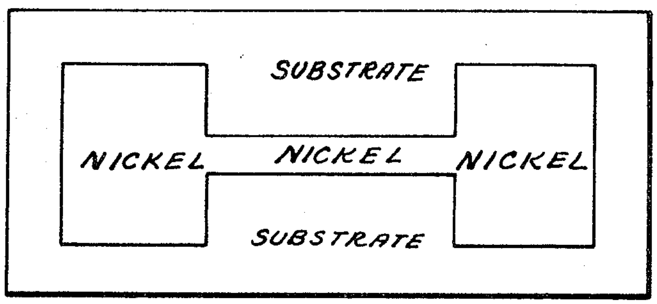
Figure 9:
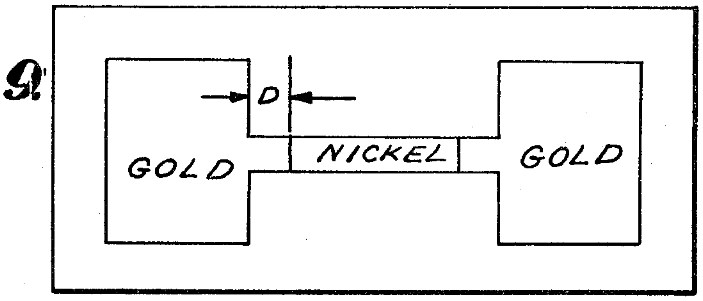
Figure 10:
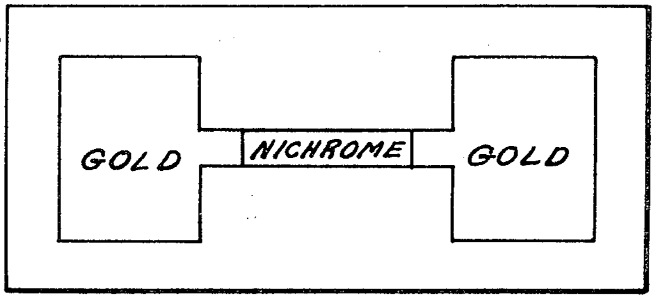
Figure 6:
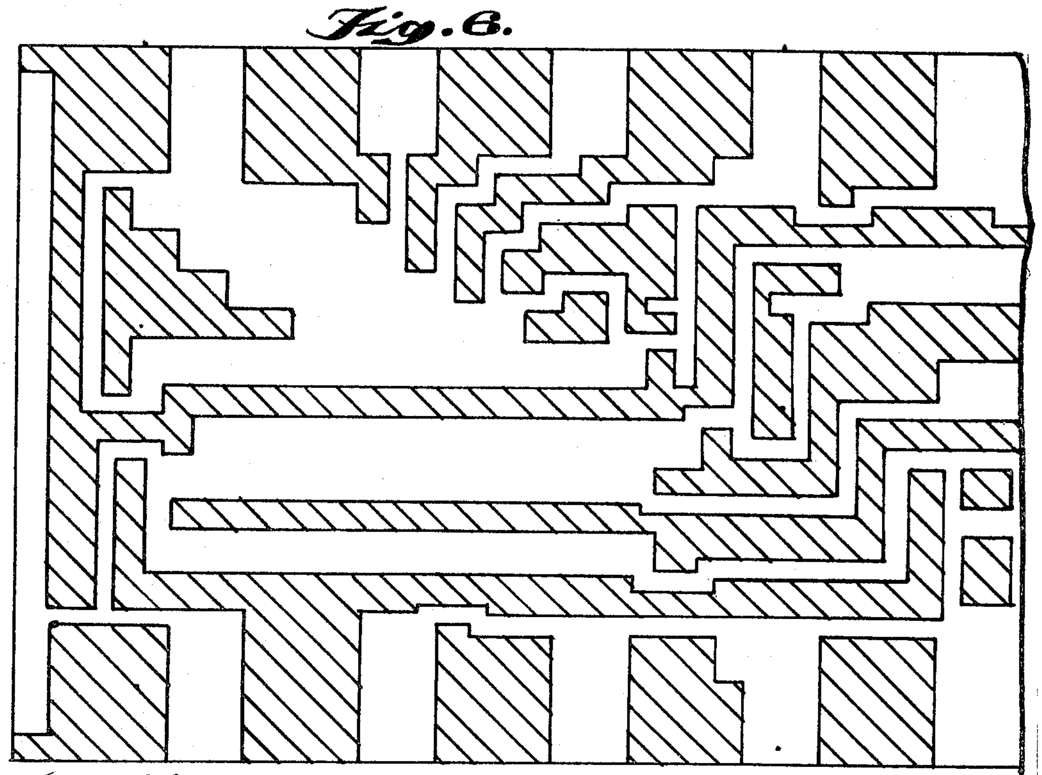
Figure 7:
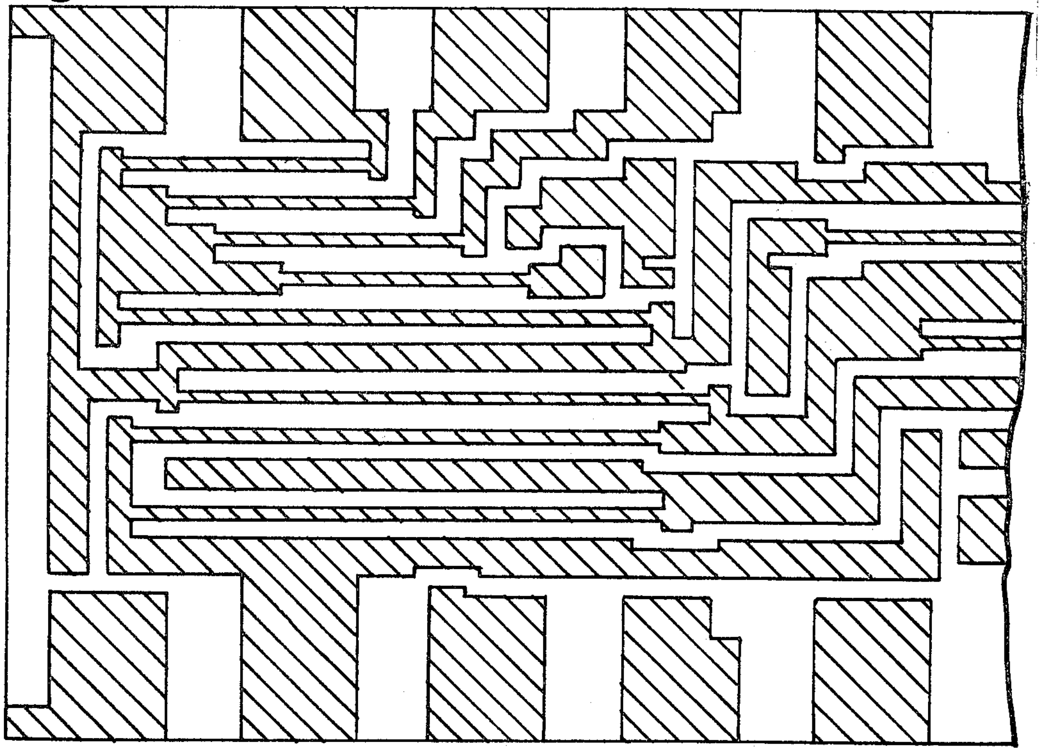

FIGURES 6 and 7 show masks similar to those in FIGURES 1 and 2 but suitable for producing a large number of resistors and electrical connectors therefor; and FIGURES 8 through 10 show top views of a circuit module in successive stages of manufacture when an alternative method of the invention is practiced.

A preferred method for practicing the invention will now be described.

First, a substrate is preferably cleaned in some manner, such as ultrasonic waves. This substrate may have either an unglazed or a glossed ceramic surface upon which materials are deposited. Typically, a first layer of resistive material is deposited or formed on a substrate, the substrate being made of a nonconductive or insulative material. The first layer of resistive material may be Nichrome (a nickel-chromium alloy), the layer of Nichrome being, for purposes of illustration, 3000 angstroms thick. The thickness of the layer depends on the desired resistivity per unit square area that is desired on the substrate. Thus, a thickness of 3000 angstroms may correspond to a resistivity of 50 ohms per unit area. Typically, the Nichrome layer is deposited on the substrate by sputtering. On top of the Nichrome layer is deposited a second layer of material, typically nickel. This second layer is also approximately 3000 angstroms thick. One of the basic purposes of this layer is to provide a material upon which a conductor, such as gold, can be deposited or plated. Of course, if the first layer of resistive material is a type upon which a conductor such as gold or an electrical equivalent thereof, can be easily deposited or plated, it is not necessary to provide the nickel layer described above. However, in order to describe one operable embodiment of the invention, the following description will include a layer of nickel deposited or formed upon a layer of Nichrome.

Upon the layer of nickel is deposited a layer of gold which serves as a connector to the resistive component formed from the resistive layer and as a base upon which other components such as semiconductors, connecting wires, or ceramic capacitors are mounted.

Because of the multiple depositions or layers upon the substrate, it is desirable to employ apparatus which will provide these depositions during a single vacuum cycle of the sputtering device, thereby increasing the production rate of the circuit modules, which comprise the resistive and active components mentioned above.

Figure 3:
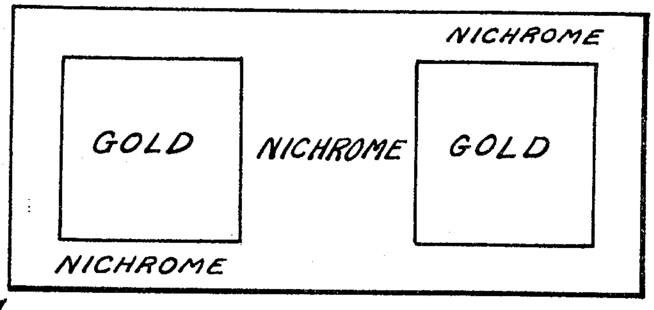
FIGURES 3 and 4 show top views of a circuit module in successive stages of manufacture when the preferred method of this invention is practiced.

Referring now to FIGURES 1 and 2, there are shown the masks which respectively define the value of a single resistor and the electrical connectors therefor, it, of course, being understood that a plurality of resistors will typically be defined on a single substrate, as illustrated by FIGURES 6 and 7, which will be explained in more detail hereinafter. After the three layers of Nichrome, nickel, and gold have been formed on the substrate, a photosensitive, acid-resistant material is sprayed or printed onto the surface of the gold. Next, the sprayed surface is covered wtih a mask similar to that shown in FIGURE 1. That is, the areas within the solid squares 10 and 12 correspond to the mask. This mask is preferably held in close contact to the sprayed surface by some means such as a vacuum. The masked surface is then exposed to a light which exposes the acid-resistant material. The mask is then removed and the photosensitive material is developed by a wash to remove the acid-resistant material exposed to the light. The remaining photosensitive material is then cured by some method such as drying or baking. The sputtered films or layers of gold and nickel in those areas where the photosensitive material has been removed are then etched away. A combination solution available for this purpose is 20 parts potassium iodide, 10 parts iodine, and 100 parts water with a range of ±10% on each of these constituents. The remaining photosensitive material is then removed by dissolving or washing in a suitable solvent. See FIGURE 3 for a top view of the assembly after the first etch.

It would, of course, be obvious to one having ordinary skill in this art to vary the above steps in various conventional ways. For example, instead of spraying the gold layer with an acid-resistant material which develops off in areas exposed to light, an acid-resistant material may be used which remains upon exposure to light. This would, of course, necessitate reversing the mask as shown in FIGURE 1, that is, the area outside the squares 10 and 12 would be the mask, the squares 10 and 12 corresponding to open portions of the mask. Thus, broadly speaking, the mask shown in FIGURE 1 defines a first area (see reference letter A in FIGURE 1) which has a dimension $L_1$, the dimension $L_1$ being accurately produced and corresponding to the length of the resistor component to be formed from the Nichrome as will be described hereinafter.

After the etch described above, the assembly is sprayed once again by a photosensitive material which develops off upon exposure to light and is then masked as shown by the dotted lines in FIGURE 1, the mask being the lined portion of FIGURE 2. After the mask has been removed, the photosensitive material exposed, developed and cured, the sputtered film of Nichrome is etched away by a combination solution in those areas where the photosensitive material has been removed after the second mask. This solution preferably comprises 60% reagent grade hydrochloric acid, 30% reagent grade nitric acid, and 10% reagent grade hydroflouric acid, although the above percentage of the hydrochloric acid may vary from 60% to 90%, the percentage of the nitric acid may vary from 10% to 30%, and the percentage of the hydroflouric acid may vary from zero to 10%. Reagent grade hydrochloric acid is 38% hydrochloric acid; reagent grade nitric acid is 69.9% nitric acid; and reagent grade hydroflourc acid is 48% hydroflouric acid. This etch is used because both the substrate heating and the hydrochloric acid-nitric acid combination (aqua regia) will oxidize some sputtered materials thereby forming undesirable leakage resistance on the substrate area which is to be etched bare. The hydroflouric acid will etch these oxidized materials away thus eliminating the leakage resistance. Note that this solution will not attack the gold that is covered with resist and therefore the assembly is as shown in FIGURE 4.

Figure 5:
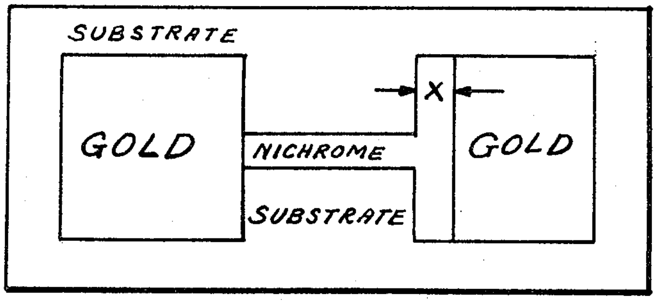
FIGURE 5 shows a partially completed circuit module where there has been an extreme misalignment between the first and second masks.

Typically, the width of the resistor is defined by the width W of the strip of the second mask. The length of this strip $L_2$ is paarallel to and greater than $L_1$ of the first mask. In order to insure manufacture of a resistor having a value within desired tolerances, the length or dimension $L_1$ must be inwardly removed from both of the ends of the strip $L_2$. That is, the registration of the second mask with respect to the first mask must be such that the length $L_1$ is inwardly removed from the ends of $L_2$ or, conversely, the length $L_2$ must be outwardly removed from both ends of the length $L_1$. Only then will a resistor of proper value be obtained. See FIGURE 5 for an example of what happens when mask 2 is improperly registered with respect to mask 1. Note that the dimension D shown in FIGURE 1 indicates a compensation distance for misalignment between the first and second masks. It is this compensation feature which permits the production of resistive or other components of precise value while at the same time permitting the manufacture of a large number of these components on a single substrate. For instance, note FIGURES 6 and 7 which respectively show the first and second masks which correspond to the masks shown in FIGURES 1 and 2 and would be employed to produce a large number of components on a single substrate or a single circuit module. Also, because of the compensation feature provided by this invention, not only can a circuit module be produced on a substrate as indicated in FIGURES 6 and 7, but also a plurality of substrates can be simultaneously produced on a single fixture in one manufacturing cycle, while at the same time minimizing registration errors if two masks the size of the fixture are employed. This mass production capability is due to the novel features of employing two masks to define the dimensions of the resistor and the electrical connections thereto. Referring to FIGURE 2, it will be noted that the second mask defines a second surface area (the strip), a first dimension (W) of which corresponds to the desired width of said resistor and a second dimension ($L_2$) which is parallel to and greater than the above-mentioned dimension $L_1$ of the first surface area established by the first mask, thereby simplifying the production of the first resistor. Also, the dimension of the first surface area is inwardly removed from both ends of the second dimension of the second surface area for insuring the production of the resistors of accurate value.

Figure 4:
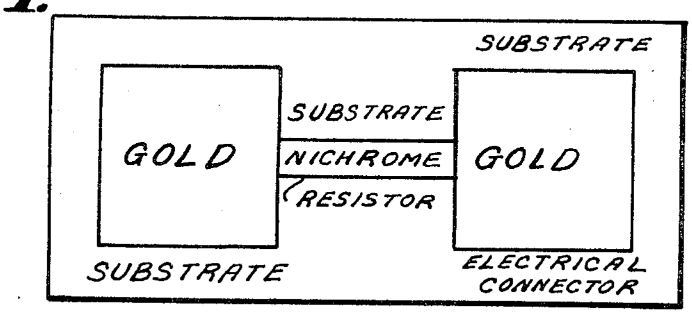

Returning to the description of the method for producing a circuit module, reference should now be made to FIGURE 4 which shows the assembly after the second etch and after all remaining photosensitive material has been removed. As noted above, it is desirable to attach a plurality of substrates to a single fixture to facilitate mass production. At this point, the substrates are removed from the fixture. The resultant resistors may be measured and those substrates having resistors outside desired tolerances are culled. This avoids further processing of worthless substrates which improves the overall yield and efficiency of the process but need not be an indispensable part of the process. The substrates may then be heated with their deposited circuitry to the melting point of a gold alloy solder in an atmosphere of forming gas such as 85% dry nitrogen and 15% dry hydrogen. The hydrogen in this mixture reduces oxides developed during the steps leading to this step. The nitrogen is a filler which keeps the oxygen from combusting. The temperature is kept below that which would cause silicon and hydrogen to react. Semiconductor dies may then be soldered to specified areas of the gold portion shown in FIGURE 4, each die having surface wettable by the gold alloy solder. It is also possible to avoid the use of solder by employing semiconductor dies which have gold on the bottom thereof, thereby facilitating bonding without solder.

Conductive wires or leads may then be thermal-compression bonded between bonded devices and gold conductive areas on other parts of the substrate. Because the gold layer is deposited or sputtered on to the nickel layer, a film or layer of high conductivity results, this layer simplifying the bonding of semiconductor die or chips and the attachment of gold wires.

After all components and wires therebetween are placed on the substrate, each substrate is selectively encapsulated, only the side of the substrate carrying the components and sputtered materials being encapsulated or potted. This bonding may be done in a continuous process by conveying the substrates under a dispenser which lays down a continuous strip of material over the components side but not extending to the edges of the substrate. The potted compound is then cured, leaving uncovered a number of conductive pads for external connection. Suitable leads may then be soldered to the remaining exposed conductive pads to complete the manufacture of the circuit module.

It should be emphasized that some of the steps employed for producing a circuit module have been described only for purpose of clarity and for describing the steps necessary to producing a finished circuit module. However, only certain of these steps have been emphasized and it is these which constitute the invention and to which the claims are directed.

Referring now to FIGURES 1 and 2, a second method will now be described for producing a circuit module, the first method described hereinbefore being more preferable, as will be expalined hereinafter. However, this second method is operable and contains many of the advantages of the invention. The description of this second method will emphasize those features which distinguish it from the first method, it being assumed that certain steps that are not mentioned would necessarily be followed by one having ordinary skill in this art, especially in view of the description of the first method. Basically, the first method comprises the steps of adding a first layer of material on a substrate, the first layer having an electrical conductivity substantially greater than that of the substrate. From this layer will be formed the resistors. Deposited on top of the first layer is a second layer having a conductivity substantially greater than that of the first layer. From this second layer will be formed the electrical connectors which are attached to the ends of the resistors. It should be noted that this generalized description of the first method lumps the nickel and gold layers (referred to in the specific description of the first method) together into a single conductive layer which corresponds to the second conductive layer just described above. After the resistive and conductive layers have been formed on the substrate, a portion of the conductive layer is removed, as described hereinbefore, to define the length of the resistor and the position of the electrical connectors with respect to the ends of the resistor. After the selective removal of material from the conductive layer, material is selectively removed from the resistive layer to define the width of the resistors, as described hereinbefore. Thus, it can be seen that the first method basically comprises the steps of (1) forming a resistive layer on the substrate, (2) forming a conductive layer on the resistive layer, (3) selectively removing a portion of the conductive layer, and then (4) selectively removing a portion of the resistive layer.

In contrast, the second method of practicing applicants' invention involves the basic steps of (1) forming the resistive layer on the substrate, (2) selectively removing portions of the resistive layer to define the width of the resistor or resistors, and (3) selectively forming on the remaining resistive layer a conductive layer which corresponds to the electrical connectors for the formed resistors. Basically, the reason that the first method is preferable to that of the second method is that the formation of the conductive layer, as described in the first method, simplifies the bonding of semiconductor die or chips and the attachment of gold connecting leads or wires to the conductive layer, as will be explained in more detail hereinafter.

Specifically, the description of the second method is as follows: after the layers of Nichrome and nickel are deposited by sputtering on the substrate in a single unbroken vacuum cycle of the sputtering device, the mask shown in FIGURE 2 is placed on top of the nickel layer after photosensitive acid-resistant material has been sprayed thereon. As can be seen from a review of the first method, the masking sequence is reversed. Thus, after exposure of the masked surfaces to light, washing and curing those unprotected areas where the photosensitive material has been removed are etched with a combination solution. This solution may comprise 60% reagent grade hydrochloric acid, 30% reagent grade nitric acid and 10% reagent grade hydroflouric acid, this solution being described with respect to the first method. After the first etch, the circuit module corresponds to that shown in FIGURE 8.

After this etch, the remaining photosensitive material is removed. The module is then again sprayed with a second coating of photosensitive acid-resistant material. The mask shown in FIGURE 1 (solid lines) is then employed to define the area upon which subsequent plating will occur. That is, the nickel underneath the areas within the squares 10 and 12 will be plated upon after the masking, exposing, developing, and curing sequence. A thick layer of nickel is plated onto unprotected areas about 100 micro inches thick, for example. At this point, it is possible to plate directly upon the last-mentioned nickel layer, a layer of gold which is compatible with the bond of semiconductor dies and other components onto the assembly. Electroless plating would be suitable for this purpose. However, it has been determined that it is preferable to chemically plate a thin layer of gold upon the nickel layer, the layer of gold being approximately five micro inches thick, for example. A layer of copper may be then chemically plated on the gold layer, the copper layer being approximately 10 micro inches thick. The final gold layer is then plated on the copper layer. The layers of gold and copper between the nickel layer and the final gold layer provide an interface of copper between the nickel layer and the final gold layer. This interface is desirable, since it diffuses into the gold at approximately 400° C. and thus the resulting layer is softer than the nickel-gold alloy which results from directly plating the final gold layer on the nickel layer. Further, it is preferable to the nickel-gold alloy, since it is more compatible with the thermocompression bonding process employed to secure electrical leads or wires to the conductive layer. However, in this regard it should be emphasized that depositing or sputtering the layer of gold onto the layer of nickel (as described in the first method) is the most preferable approach.

After the gold layer has been selectively plated upon the nickel layer, all remaining photosensitive material is then removed by appropriate means. Reference should be made to FIGURE 9 which shows the assembly after the plating of the final gold layer and the removal of the remaining photosensitive material. As can be seen, a final thin layer of nickel remains on top of the Nichrome where the resistor has been defined. This final thin layer is etched off, using a combination solution of five parts ferric chloride (10% solution) and one part reagent grade nitric acid. This solution etches away the nickel and causes a surface oxidation of the resistive material (Nichrome) which in turn halts the etching action of the solution upon the Nichrome. The ferric chloride attacks only the nickel layer and not the gold. After this step, the assembly is as shown in FIGURE 10, the end result of the second method being equivalent to that of the first method. The substrates are then removed from the mass production fixture to which they were attached, the remainder of the process being exactly the same as that described for the first method.

Referring to FIGURES 1 and 2, it will be noted that the distance D assumes its largest value when an end of $L_1$ coincides with an end of $L_2$; D, of course, not defined when the situation illustrated in FIGURE 5 occurs. The maximum value of D corresponds to the maximum misalignent between the asks shown in FIGURES 1 and 2 which can be tolerated. Typically, this maximum value of D is 0.005 inch which allows a significant leeway in the manufacture of the resistors and the connectors therefor.

After the circuit modules consisting of ceramic base substrates with resistors, semiconductors, and other components deposited or bonded upon them are complete, external leads must be bonded on them for connection to other circuits and circuit boards. The circuits after completion are ceramic substrates with a strip of potting compound covering all components, with deposited connecting pads extending out from under the epoxy potting material and to the edge of the substrates. The pads are conductive material deposited or plated in the manufacture of the chips themselves as indicated by the gold portion of FIGURE 4 with the exception that a pad will extend to the side of the substrate (not shown). In the description of the first method, it was stated that the external leads were connected to the conductive pads after the encapsulating step. However, it is preferable to connect these leads to the pads before the encapsulation, this resulting in a stronger mechanical package.

The bonding of the semiconductor devices is not limited to a single die and blocks containing several diode or transistor elements have been successfully bonded on to the circuits.

Still numerous other modifications of the invention will become apparent to one of ordinary skill in the art upon reading the foregoing disclosure. During such a reading, it will be evident that this invention has provided a unique method for accomplishing the objects and advantages herein stated. Still other objects and advantages, and even further modifications will be apparent from this disclosure. It is to be understood, however, that the foregoing disclosure is to be considered exemplary and not limitative, the scope of the invention being defined by the following claims.

What is claimed is:

1. A process for producing at least one resistor having a value within a desired tolerance and electrical connectors to said resistor, said process comprising the following steps:

(1) forming on an electrically non-conductive material, a layer of electrically resistive material having a condutivity substantially greater than said non-conductive material to obtain the desired thickness of said resistor;

(2) forming on said resistive layer a layer of electrically conductive material having a conductivity substantially greater than said resistive layer;

(3) defining by a first mask a first surface area on said conductive layer, a dimension of said area corresponding to the desired length of said resistor;

(4) removing the conductive layer defined by said first surface area to obtain the desired length of said resistor, the conductive material remaining being the said electrical connectors for said resistor;

(5) defining by a second mask a second surface area having a first dimension corresponding to the width of said resistor and a second dimension parallel to and greater than said dimension of said first surface area, thereby simplifying the registration of said second surface area with respect to said first surface area and hence simplifying the production of said resistor, said dimension of said first surface area being inwardly removed from both ends of said second dimension of said second surface area thereby insuring that the value of said resistor is within said tolerance; and (6) removing the resistive layer remaining after the surface definition of the last step to obtain said resistor of desired value.

2. A process as in claim 1 wherein the maximum distance that said dimension of said first surface area can be removed from either of said ends is 0.005 inch.

3. A process as in claim 1 where the thickness of said resistive layer determines the ohms per unit area.

4. A process as in claim 1 where a plurality of resistors and electrical connectors therefor are formed on said non-conductive material, each of the resistors and connectors therefor being formed by the process recited in claim 3.

5. A process as in claim 1 including the additional step after step (6) of attaching at least one active or passive component such as a semi-conductor die to the conductive layer remaining after step (4) by (a) heating the assembly resulting from step (6), in a forming gas which reduces any oxides formed during steps (1)–(6) and which has a filler to eliminate the possibility of combustion, to the melting temperature of a solder suitable for bonding the said active component to the said conductive layer, said heating also annealing the resistor formed in step (6) to stabilize the value thereof; and (b) bonding said component to said layer.

6. A process as in claim 5 wherein said forming gas is approximately 85–90% dry nitrogen and 10–15% dry hydrogen.

7. A process as in claim 5 where electrical leads or wires are connected to said active components and to said conductive layer by thermal compression bonding.

8. A process as in claim 7 where said conductive layer extends to the side of said non-conductive material thereby forming pads suitable for having further electrical wires attached thereto, said further wires being external to the components attached onto said non-conductive material; said process including the additional steps of connecting said external wires to said conductive pads and encapsulating the attached component thereby resulting in a mechanically strong circuit module.

9. A process as in claim 1 including the additional step after step (1) of forming on said resistive layer a further layer of material upon which said conductive layer can be readily formed; said conductive layer being formed on said further layer; the material being removed in step (4) also including the further layer defined by said first surface area.

10. A process as in claim 9 where the resistive layer is a nickel-chromium alloy, the further layer is nickel, and the conductive layer is gold.

11. A process as in claim 10 where the gold and nickel are removed in step (4) by etching with a combination solution of 20 parts potassium iodide, 10 parts iodine, and 100 parts water, there being a ± 10% range on each of the constituents.

12. A process as in claim 11 where the nickel-chromium alloy is removed in step (6) by etching with a combination solution of 60–90% reagent grade hydrochloric acid, 10–30% reagent grade nitric acid, and 0–10% reagent grade hydrofluoric acid.

13. A process as in claim 1 where all of said layers are formed by sputtering.

14. A process for producing at least one resistor having a value within a desired tolerance and electrical connectors to said resistor, said process comprising the following steps:

(1) forming on an electrically non-conductive material, a layer of an electrically resistive material having a conductivity substantially greater than said nonconductive material to obtain the desired thickness of said resistor;

(2) defining by a first mask a first surface area on said resistive layer, a first dimension of said area defining the width of said resistor and a second dimension of said area being greater than the desired length of said resistor;

(3) removing the resistive layer remaining after the surface definition of step (2) to obtain the desired width of the resistor;

(4) defining by a second mask a second surface area parallel to said second area having a dimension parallel to and less than the said second dimension of said first surface area, said dimension of said second surface area (a) defining the length of said resistor thereby simplifying the registration of said second surface area with respect to said first surface area and hence simplifying the production of said resistor and (b) inwardly removed from both ends of said second dimension of said first surface area thereby insuring that the value of said resistor is within said tolerance; and (5) forming a layer of conductive material having a conductivity substantially greater than said resistive layer on the portion of said resistive layer remaining after the surface definition of step (4) thereby forming said electrical connectors.

15. A process as in claim 14 where the maximum distance that said dimension of said second surface area can be removed from either of said ends is 0.005 inch.

16. A process as in claim 14 including the additional step after step (1) of forming on said resistive layer a further layer of material upon which said conductive layer can be readily formed; the definition of said first area in step (2) taking place on said further layer; the material being removed in step (3) including the further layer remaining after the surface definition of step (2); said conductive layer being formed in step (5) on said further layer; said process including the additional step after step (5) of removing the further layer on the resistive layer defined by said first surface area and thereby forming said resistor.

17. A process as in claim 16 where the resistive layer is a nickel-chromium alloy, the further layer is nickel, and the conductive layer is gold.

18. A process as in claim 17 where said nickel-chromium alloy and nickel layers are removed in step (3) by etching with a combination solution of 60–90% reagent grade hydrochloric acid, 10–30% reagent grade nitric acid, and 0–10% reagent grade hydrofluoric acid.

19. A process as in claim 18 where said nickel is removed in the additional step after step (5) by a combination solution of 4–6 parts ferric chloride (5–20% solution) and 0–2 parts reagent grade nitric acid.

20. A process as in claim 16 including the additional steps after the additional step after step (1) of forming an interface between said further layer and said conductive layer, said interface diffusing into the conductive layer upon heating thereby softening said conductive layer and making it compatible with thermocompression bonding of components thereto.

21. A process as in claim 20 where said resistive and further layers are a nickel-chromium alloy and nickel respectively, said interface is copper, and said conductive layer is gold.

References Cited

UNITED STATES PATENTS

| | | | |
|---|---|---|---|
| 2,692,190 | 10/1954 | Pritikin. | |
| 2,849,583 | 8/1958 | Pritikin. | |
| 2,864,926 | 12/1958 | Pritikin | 238—308 |
| 3,020,156 | 2/1962 | Rowe | 117—212 X |
| 3,022,570 | 2/1962 | Taylor | 29—621 X |
| 3,061,911 | 11/1962 | Baker | 29—620 X |
| 3,193,408 | 7/1965 | Triller | 117—212 |
| 3,362,851 | 1/1968 | Dunster | 117—212 |
| 3,377,697 | 4/1968 | Hobbs | 29—621 |

JOHN F. CAMPBELL, *Primary Examiner.*

J. L. CLINE, *Assistant Examiner.*